US006972642B2

(12) United States Patent
Oshio

(10) Patent No.: US 6,972,642 B2
(45) Date of Patent: Dec. 6, 2005

(54) METHOD OF CONTROLLING FREQUENCY OF SURFACE ACOUSTIC WAVE DEVICE AND ELECTRONIC APPARATUS

(75) Inventor: Masahiro Oshio, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 52 days.

(21) Appl. No.: 10/731,007

(22) Filed: Dec. 10, 2003

(65) Prior Publication Data

US 2004/0164821 A1    Aug. 26, 2004

(30) Foreign Application Priority Data

Dec. 17, 2002  (JP) ............................. 2002-364555
Sep. 11, 2003  (JP) ............................. 2003-319554

(51) Int. Cl.[7] ............................. H03H 9/64; H03H 3/10
(52) U.S. Cl. ...................... 333/193; 333/195; 29/25.35
(58) Field of Search ............................... 333/193–196, 333/150–155, 133; 310/313 R, 313 A–313 D; 29/25.35

(56) References Cited

U.S. PATENT DOCUMENTS

| 6,321,444 B1 * | 11/2001 | Yatsuda et al. ............... 29/832 |
| 6,762,537 B1 * | 7/2004 | Kikushima .................. 310/348 |
| 6,781,484 B2 * | 8/2004 | Matsuta ...................... 333/193 |

FOREIGN PATENT DOCUMENTS

| JP | A 63-305604 | 12/1988 |
| JP | A 3-19406 | 1/1991 |
| JP | A 9-162691 | 6/1997 |
| JP | A 2000-156620 | 6/2000 |
| JP | A 2002-33633 | 1/2002 |
| JP | A 2003-69380 | 3/2003 |

OTHER PUBLICATIONS

K. Weiss et al.; "SAW Resonators Frequency Trimming By Plasma Etching", European Frequency Time Forum, 1996 IEE Conference Publication No. 418, pp. 155-158, Mar. 1996.*
R. Subramanian et al.; "Production Trimming of SAW Devices Using $CF_4$ Chemistry and its Effects on SAW Characteristics", 1996 IEEE Ultrasonics Symposium Proceedings, vol. 1, pp. 255-260, Nov. 1996.*

* cited by examiner

Primary Examiner—Barbara Summons
(74) Attorney, Agent, or Firm—Oliff & Berridge, PLC

(57) ABSTRACT

The invention provides a surface acoustic wave device capable of precisely controlling a frequency, of reducing changes in the center frequency with the lapse of time after controlling the frequency, and of performing a stable operation for a long time. The thickness of an IDT electrode formed on a quartz substrate is set to be slightly larger than the desired thickness so that the center frequency is slightly lower than the desired frequency. Next, a voltage is applied to the IDT electrode and the center frequency is measured. At this time, the measured center frequency is slightly lower than the desired frequency. The rear surface of the quartz substrate is etched while checking the measured center frequency. As a result, the measured center frequency gradually increases and approaches the desired frequency by etching the rear surface of the quartz substrate. Further, the rear surface of the quartz substrate is continuously etched until the center frequency is the desired frequency. The etching is stopped at the point of time where the measured center frequency is the desired frequency.

10 Claims, 8 Drawing Sheets

METHOD OF CONTROLLING FREQUENCY OF SURFACE ACOUSTIC WAVE DEVICE AND ELECTRONIC APPARATUS

BACKGROUND OF THE INVENTION

1. Field of Invention

The present invention relates to a method of controlling the frequency of a surface acoustic wave device and an electronic apparatus using a surface acoustic wave device controlled by the frequency controlling method.

2. Description of Related Art

A surface acoustic wave device is a circuit element that converts electric signals into surface waves, thereby processing signals. The surface acoustic wave device is widely used as a filter and a resonator. In common, the surface acoustic wave device is obtained by disposing an electrode formed of a conductive film, which is referred to as an inter digital transducer (IDT) electrode, on a piezoelectric acoustic substrate (a piezoelectric substrate) and performs conversion and inversion from the electric signals to the surface waves. The characteristic of the surface acoustic wave device depends on the transfer characteristic of the surface acoustic wave for transferring the piezoelectric substrate. In particular, in order to correspond to increase in the frequency of the surface acoustic wave device, it is necessary to use a surface acoustic wave having high phase velocity.

When a pseudo-longitudinal leaky surface acoustic wave having the high phase velocity is used by using crystal, the width of an electrode line for processing a signal having a frequency of 1 GHz is 1.4 $\mu$m. Therefore, it is possible to manufacture a surface acoustic wave device capable of making electrodes minute and of processing signals having frequencies of 1 to 3 GHz by a current electrode processing technology. However, the electrodes are made finely according to the surface acoustic wave device operating at a high frequency. Therefore, the completed size, such as the width and the thickness of the electrodes, are not uniform. As a result, a center frequency changes, thereby greatly deteriorating a yield rate.

The frequency of the surface acoustic wave device is controlled by finely etching the electrode of a chip or the surface of the piezoelectric substrate. Among frequency controlling devices, a reactive ion etching (RIE) device is the most precise. Also, unevenness of qualities of manufactured products is small. The frequency of the surface acoustic wave device is controlled by etching electrode materials, such as aluminum using the RIE device and a chlorine-based gas, thereby increasing the frequency. In the frequency controlling method, the oxide film naturally formed on the surface of the electrode as well as the electrode is etched. Therefore, oxidation proceeds again after controlling the frequency. As a result, changes in the thickness of the oxide film affect the center frequency of a device.

Since the oxidation gradually proceeds, the center frequency must be measured in a state where the oxide film is stabilized. The center frequency measured in a state where the oxide film is unstable, possibly changes when products are forwarded, due to oxidation after an assembling process. Since the oxide film on the surface of the electrode is naturally formed, unless the thickness of the oxide film is controlled or managed, the center frequency changes with the lapse of time and the reliability of a device is significantly affected. In particular, since the width of an electrode or the thickness of an electrode film is reduced in the surface acoustic wave device having a high frequency. Therefore, it is preferable to correctly control the frequency.

In a method of correctly controlling the frequency, the frequency is controlled by forming the oxide film of the electrode to a thickness where a chemical bonding with oxygen in the air does not occur. For example, refer to Japanese Unexamined Patent Application Publication No. 2000-156620. However, according to the method, an oxide film forming process and an electrode etching process are repeatedly performed. Therefore, a gas inside an RIE etching manufacturing chamber must be exchanged, thereby making processes complicated.

On the other hand, it is possible to form grooves on the surface of the quartz substrate and to reduce the center frequency by exchanging a reaction gas from a chlorine-based gas to a fluorine-based gas. When the surface of the quartz substrate is etched by the fluorine-based gas, the thickness of the electrode oxide film does not change. Therefore, it is not necessary to consider the influence of the thickness of the oxide film. As a result, it is necessary to etch the surface of the quartz substrate only to a thickness where a desired frequency is obtained.

According to the method, the surface of the electrode film deteriorates and aluminum fluoride is formed because highly reactive fluorine based radical chemically combines with aluminum that is a material of the electrode film on the surface of the surface acoustic wave device. When the chip is left in the air, the frequency changes and plus shift is caused. In order to solve the problems, the oxide film is formed on the surface of the IDT electrode before controlling the frequency by the fluorine-based gas, thereby protecting the surface of the IDT electrode by the firm oxide film. For example, refer to Japanese Unexamined Patent Application Publication No. 2002-33633. As a result, the IDT electrode is not eroded by reactive fluorine such as the fluorine-based radical though plasma etching is performed using the fluorine-based gas.

In a process of forming an electrode by dry etching, aluminum etched by plasma resides on the surface of the substrate. The residing aluminum possibly changes the transfer characteristic during a process of controlling the frequency and undesirably changes the frequency. As electronic apparatuses are miniaturized, an oscillator using a crystal vibrator is miniaturized like other various electronic parts in order to increase parts mounting density in a print circuit board. For example, as illustrated in Japanese Unexamined Patent Application Publication No. 63-305604 a package of the crystal vibrator is mounted on an IC package that holds the main body of an oscillating circuit in order to reduce the mounted area. As illustrated in Japanese Unexamined Patent Application Publication No. 3-19406, the crystal vibrator and an IC chip are held in a package.

When a surface acoustic wave element and the IC chip are held in a package, it is more advantageous to miniaturizing the package to overlap the surface acoustic element and the IC chip each other. In particular, when a face down bonding (FDB) manufacturing method is used and the surface acoustic element is electrically connected to the IC chip, wire bonding is unnecessary. Therefore, it is possible to miniaturize the package (refer to Japanese Unexamined Patent Application Publication No. 9-162691.). It is possible to realize the surface acoustic device having an excellent high frequency characteristic in order to reduce the influences of inductive reactance and stray capacitance that are caused by wires and circuit patterns. It is possible to reduce the costs of products and to simplify manufacturing processes because only one package is necessary.

As mentioned above, when the surface acoustic wave element and the IC chip are held in one package, the frequency is controlled by driving the surface acoustic wave element by the IC chip and irradiating the plasma into the surface acoustic wave element.

SUMMARY OF THE INVENTION

As mentioned above, several methods are used for controlling the frequency of the surface acoustic wave device. However, as the operation frequency of the surface acoustic wave device increases, the IDT electrode formed on the quartz substrate becomes fine. The amount of changes in the center frequency increases because completed sizes such as the widths of the electrodes and the thickness of the films are not uniform. Therefore, it is required to precisely control the frequency in the method of controlling the frequency of the surface acoustic wave device. At the same time, it is preferable to realize the surface acoustic wave device capable of reducing changes in the center frequency with the lapse of time after controlling the frequency and of performing stable operations for a long time.

On the other hand, when the surface acoustic wave element and the IC chip are held in one package, the frequency is controlled by finely etching the surface of the electrode of the surface acoustic wave element or the surface of the electrode substrate. Therefore, when the surface acoustic wave element is formed on the IC chip by the FDB manufacturing method, it is difficult to control the frequency. In the process of controlling the frequency, when the plasma is irradiated into the surface acoustic wave element, the IC chip as well as the surface acoustic wave element is mounted in the package. Therefore, problems, such as deterioration in the operation, occur because the IC chip is exposed to the plasma.

Accordingly, an object of the present invention is to provide a method of controlling the frequency of a surface acoustic wave device capable of realizing a surface acoustic wave device capable of precisely controlling the frequency, of reducing changes in the center frequency with the lapse of time after controlling the frequency, and of performing a stable operation for a long time. Another object of the present invention is to provide a method of controlling the frequency of a surface acoustic wave device capable of easily controlling the frequency without deteriorating the IC chip when the surface acoustic wave device is formed so that the surface acoustic wave element and the IC chip are held in the package.

Another object of the present invention is to provide an electronic apparatus using a filter or a vibrator capable of reducing changes in the center frequency with the lapse of time and of performing a stable operation for a long time.

In order to solve the above problems and to achieve the above objects, the respective inventions are formed as follows. According to the invention, there is provided a method of controlling the frequency of a surface acoustic wave device, comprising a quartz substrate and IDT electrodes formed on the quartz substrate, the IDT electrode exciting quasi-longitudinal leaky surface acoustic waves. Herein, the frequency is controlled by controlling the thickness of the quartz substrate using the surface that faces the surface where the IDT electrodes are formed.

According to the invention, in the method of controlling the frequency of the surface acoustic wave device described above, the frequency is controlled by dry etching the surface that faces the surface of the quartz substrate where the IDT electrodes are formed. Accordingly, it is possible to control the frequency without eroding the electrode patterns formed on the electrode formed surface of the quartz substrate.

Therefore, it is possible to realize the surface acoustic wave device capable of reducing changes in the center frequency with the lapse of time and of performing a stable operation for a long time.

It is possible to precisely control the frequency because changes in the frequency with respect to the etching amount are small compared with the case where the frequency is controlled by etching the electrode formed surface. According to the present invention, in the method of controlling the frequency of the surface acoustic wave device according to the first or second invention, at least one of the surface of the quartz substrate where the IDT electrode are formed and the surface of the IDT electrode is etched, thereby preliminarily controlling the frequency before controlling the frequency.

Therefore, when it is necessary to significantly control the frequency, it is possible to precisely control the frequency by etching the surface that faces the electrode formed surface after roughly controlling the frequency by wet etching the electrode formed surface. Therefore, it is possible to control the frequency for a short time. In this case, it is not necessary to etch the electrode formed surface using the plasma. Therefore, it is possible to provide a surface acoustic wave device capable of preventing the frequency from changing due to the residing aluminum as in the conventional art and of performing a stable operation for a long time.

According to a fourth invention, there is provided a method of controlling the frequency of a surface acoustic wave device, having a quartz substrate and IDT electrodes formed on the quartz substrate, the IDT electrode exciting quasi-longitudinal leaky surface acoustic waves formed on the quartz substrate. The frequency is controlled by arranging the surface acoustic wave device such that the quartz substrate is held in a package so that the IDT electrodes face downward in a chamber, to which an etching gas is introduced, and etching the surface that faces the surface of the quartz substrate where the IDT electrodes are formed until a desired frequency is obtained while measuring the input-output characteristic of the surface acoustic wave device.

Therefore, it is possible to etch the surface that faces the electrode formed surface of the quartz substrate after mounting the quartz substrate where the IDT electrodes are formed on the package and to easily control the frequency of the surface acoustic wave device. According to the present invention, there is provided a method of controlling the frequency of a surface acoustic wave device, comprising a quartz substrate and IDT electrodes formed on the quartz substrate, the IDT electrode exciting a pseudo-longitudinal leaky surface acoustic wave. The frequency is controlled by arranging the surface acoustic wave device such that the quartz substrate is held in a package with an aperture so that the IDT electrodes face upward in a chamber, to which an etching gas is introduced, and etching the surface that faces the surface of the quartz substrate where the IDT electrodes are formed until a desired frequency is obtained while measuring the input-output characteristic of the surface acoustic wave device.

Therefore, it is possible to easily control the frequency of the surface acoustic wave device by etching the surface that faces the electrode formed surface of the quartz substrate even when the surface acoustic wave element is mounted on the package so that the IDT electrodes face upward and the wire bonding is performed. According to the present invention, there is provided a method of controlling the frequency of a surface acoustic wave device, having a quartz substrate, a surface acoustic wave element having IDT electrodes formed on the quartz substrate, the IDT electrode exciting quasi-longitudinal leaky surface acoustic waves, an IC chip operating together with the surface acoustic wave element, and a package. The frequency is controlled by holding the IC chip on the bottom portion side of a package, arranging the surface acoustic wave device such that the surface acoustic wave element is held in the package so that the IDT electrodes face downward and cover the IC chip in a chamber, to which an etching gas is introduced, and etching the surface that faces the surface of the quartz substrate where the IDT electrodes are formed until a desired frequency is obtained while measuring the input-output characteristic of the surface acoustic wave element.

Therefore, it is possible to etch the surface that faces the electrode formed surface of the quartz substrate without occurring problems in the IC chip and to easily control the frequency of the surface acoustic wave device even when the surface acoustic wave element and the IC chip are held in one package. It is possible to miniaturize the package because it is possible to hold the surface acoustic wave element and the IC chip in one package.

According to the present invention, in the method of controlling the frequency of the surface acoustic wave device as described above, at least one of the surface of the quartz substrate where the IDT electrodes are formed and the surface of the IDT electrodes is etched, thereby preliminarily controlling the frequency before controlling the frequency. Therefore, when it is necessary to significantly control the frequency, it is possible to precisely control the frequency by etching the surface that faces the electrode formed surface after roughly controlling the frequency by wet etching the electrode formed surface. As a result, it is possible to control the frequency for a short time.

In this case, it is not necessary to etch the electrode formed surface using the plasma. Therefore, it is possible to provide a surface acoustic wave device capable of preventing the frequency from changing due to the residing aluminum as in the conventional art and of performing a stable operation for a long time. According to the invention, there is provided an electronic apparatus having a surface acoustic wave device as a filter or a resonator. The surface acoustic wave device is the surface acoustic wave device whose frequency is controlled by the method according to any one of the above inventions.

Therefore, it is possible to provide an electronic apparatus using a filter or a vibrator capable of reducing changes in the center frequency with the lapse of time and of performing a stable operation for a long time. According to the present invention, it is possible to realize a surface acoustic wave device capable of precisely controlling the frequency, of reducing changes in the center frequency with the lapse of time after controlling the frequency, and of performing a stable operation for a long time. Also, according to the present invention, when the surface acoustic wave device is formed so that the surface acoustic wave element and the IC chip are held in the package, it is possible to easily control the frequency of the surface acoustic wave device and to prevent problems from occurring in the IC chip when the frequency is controlled.

According to the present invention, it is possible to realize various electronic apparatuses using filters or vibrators, capable of reducing changes in the center frequencies with the lapse of time and of performing stable operations for a long time.

BRIEF DESCRIPTION OF THE DRAWINGS

The invention will be described with reference to the accompanying drawings, wherein like numerals reference like elements, and wherein:

FIG. 1(a) is a perspective view thereof; and FIG. 1(b) is a cross-sectional view taken along the line A—A of FIG. 1(a);

DETAILED DESCRIPTION OF PREFERRED EMBODIMENTS

Figure 1:
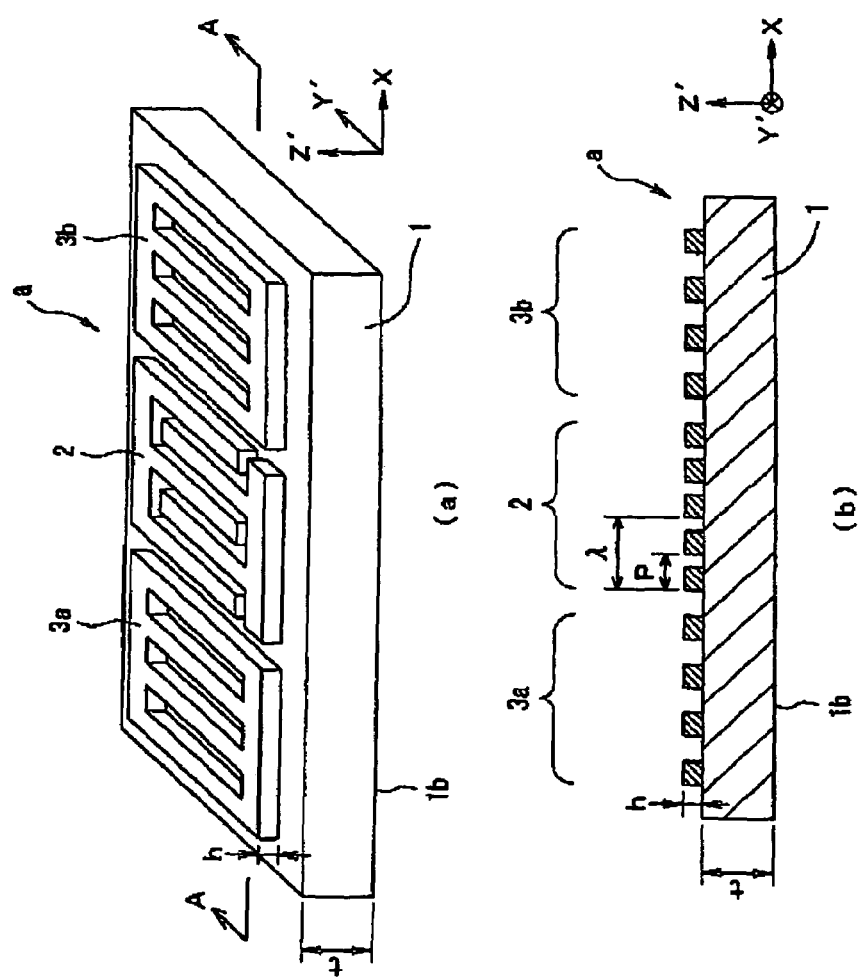
FIG. 1 illustrates a schematic structure of a surface acoustic wave device, to which a frequency controlling method according to the present invention is applied, where

Hereinafter, embodiments of the present invention will be further illustrated with reference to the drawings. FIG. 1(a) is a perspective view illustrating a schematic structure of a surface acoustic wave device a, to which a frequency controlling method according to the present invention is applied. FIG. 1(b) is a cross-sectional view taken along the line A—A of FIG. 1(a). As shown in FIG. 1, the surface acoustic wave device a includes a quartz substrate 1, an IDT electrode 2 formed on the principal plane of the quartz substrate 1, and reflector electrodes 3a and 3b.

In FIG. 1, t denotes the thickness of the quartz substrate 1. P denotes the pitch of the IDT electrode 2. λ denotes an IDT wavelength. h denotes the thickness of the IDT electrode 2. Herein, the quartz substrate 1 is cut so that quasi-longitudinal leaky surface acoustic waves are excited. The quartz substrate 1 has a predetermined thickness t and transfers the quasi-longitudinal leaky surface acoustic waves.

The IDT electrode 2 is made of aluminum and is formed on the quartz substrate 1. The IDT electrode 2 excites the pseudo-longitudinal leaky surface acoustic wave by supplying a driving voltage and outputs the vibration of a predetermined frequency. The reflector electrodes 3a and 3b are made of aluminum and are formed on the quartz substrate 1 so as to interpose the IDT electrode 2. The reflector electrodes 3a and 3b reflect and hold the pseudo-longitudinal leaky surface acoustic wave excited by the IDT electrode 2.

Figure 2:
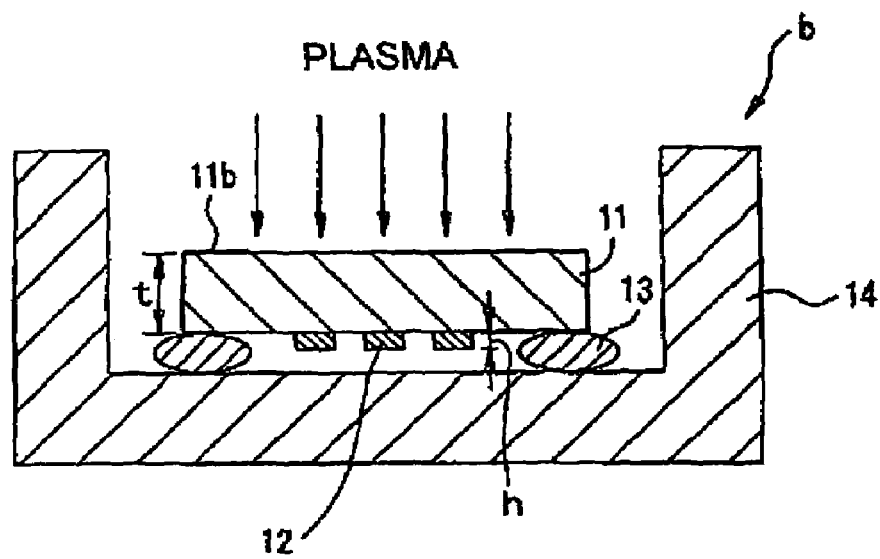
FIG. 2 is a cross-sectional view of a main portion of another surface acoustic wave device, to which the frequency controlling method according to the present invention is applied.

In the surface acoustic wave device, a, having the above structure, when it is necessary to control the frequency as mentioned hereinafter, at least the surface 1b that faces the electrode formed surface of the quartz substrate 1 is etched, thereby controlling the thickness t of the quartz substrate 1 so that the desired center frequency is obtained. FIG. 2 is a cross-sectional view of the main portion of a surface acoustic wave device b, to which the frequency controlling method according to the present invention is applied.

In the surface acoustic wave device b, a quartz substrate 11 where an IDT electrode 12 is formed is electrically and mechanically connected to a ceramic package 14 through gold bumps 13 so that the IDT electrode 12 faces downward, which is performed by a face down bonding (FDB) manufacturing method. Further, the structure of the IDT electrode 12 formed on the quartz substrate 11 is the same as the structure of the IDT electrode 2 formed on the quartz substrate 1 of FIG. 1. Therefore, description thereof will be omitted.

In the surface acoustic wave device, b, having the above structure, the surface 11b that faces the electrode formed surface of the quartz substrate 11 is etched, thereby controlling the thickness t of the quartz substrate 11 so that the desired center frequency is obtained as mentioned hereinafter. The ceramic package 14 is sealed after controlling the frequency. As a result, it is possible to easily miniaturize the surface acoustic wave device and it is not necessary to use an adhesive. Therefore, the inside of the package is stabilized. It is possible to etch the surface 11b that faces the surface of the quartz substrate 11 where the IDT electrode 12 is formed by performing plasma etching using a fluorine gas, and thereby to control the thickness t of the quartz substrate 11 so that the desired center frequency is obtained.

Figure 3:
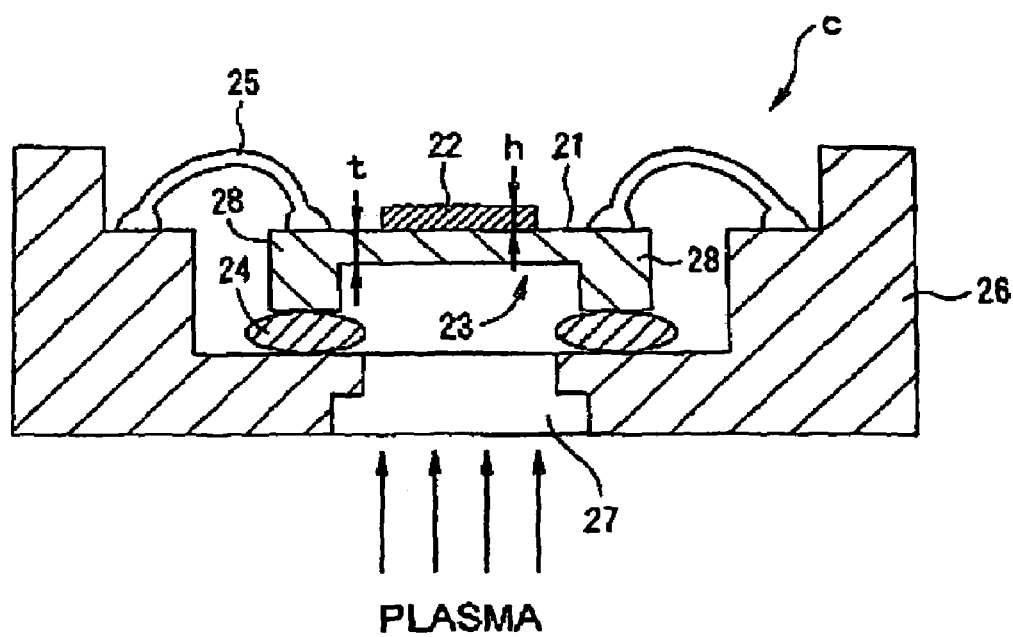
FIG. 3 is a cross-sectional view of a main portion of another surface acoustic wave device, to which the frequency controlling method according to the present invention is applied.

FIG. 3 is a cross-sectional view of the main portion of a surface acoustic wave device c, to which the frequency controlling method according to the present invention is applied. In the surface acoustic wave device c, a quartz substrate 21 where an IDT electrode 22 is formed is connected to a ceramic package 26 using adhesives 24 so that the IDT electrode 22 faces upward. Further, the electrode on the quartz substrate 21 is connected to the electrode of the ceramic package 26 through bonding wires 25.

A reinforcing portion 28 is formed along the outer circumference on the rear surface side of the quartz substrate 21. A concave portion 23 is formed in the rear surface of the quartz substrate 21 by the reinforcing portion 28. The concave portion 23 at least corresponds to the range where the IDT electrode 22 on the quartz substrate 21 is formed. In the concave portion 23, the thickness t of the quartz substrate 21 is controlled by etching the quartz substrate so that the desired center frequency is obtained as described hereinafter.

In order to control the frequency, an aperture 27 is formed on the bottom portion of the ceramic package 26 so as to correspond to the concave portion 23 of the quartz substrate 21. It is possible to control the thickness t of the quartz substrate 21 of the concave portion 23 by connecting the quartz substrate 21 to the ceramic package 26 and etching the rear surface of the quartz substrate 21 through the aperture 27. After controlling the frequency, the aperture 27 is closed and also the ceramic package 26 is sealed.

In addition, the structure of the IDT electrode 22 formed on the quartz substrate 21 is the same as the IDT electrode 2 formed on the quartz substrate 1 of FIG. 1. Therefore, detailed description thereof is omitted. In the above structure, according to the surface acoustic wave device c, it is possible to perform wire bonding on the surface of the quartz substrate 21 where the IDT electrode 22 is formed and thereby to control the frequency so that the desired frequency is obtained.

Figure 4:
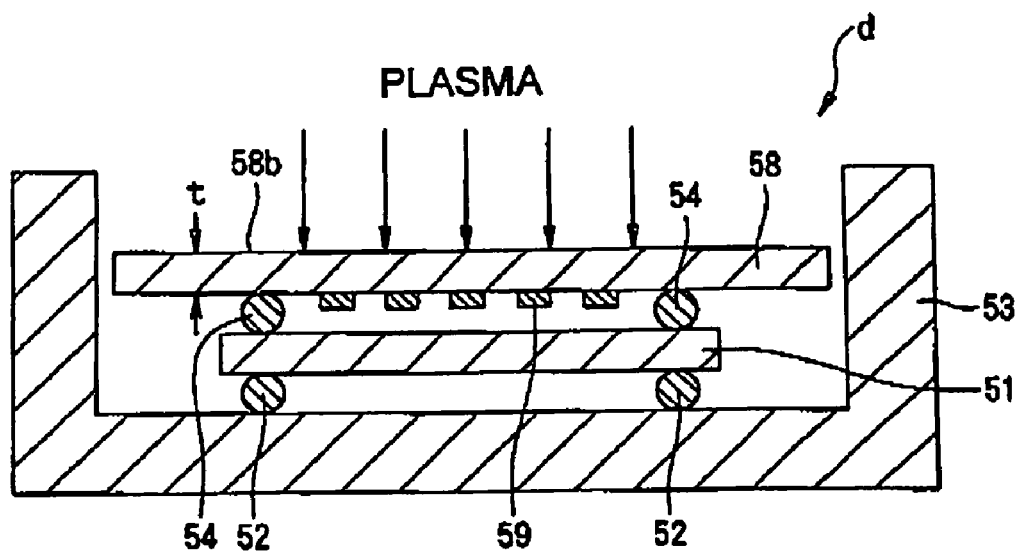
FIG. 4 is a cross-sectional view of a main portion of another surface acoustic wave device, to which the frequency controlling method according to the present invention is applied.

FIG. 4 is a cross-sectional view of the main portion of a surface acoustic wave device, d, to which the frequency controlling method according to the present invention is applied. In the surface acoustic wave device, d, an IC chip 51 is electrically and mechanically coupled to the bottom portion inside a ceramic package 53 using gold bumps 52. A quartz substrate 58 above the IC chip 51 is connected to the IC chip by gold bumps 54 so that the IDT electrode 59 faces downward, which is performed by a face down bonding (FDB) manufacturing method. As illustrated in FIG. 4, the IC chip 51 is coated with the quartz substrate 58.

Herein, the surface acoustic wave element is formed of the quartz substrate 58 and the IDT electrode 59. Further, the IC chip 51 operates together with the surface acoustic wave element. For example, in case that the surface acoustic wave device d vibrates, the surface acoustic element corresponds to the vibrator. The IC chip 51 corresponds to an amplifying circuit for operating the surface acoustic wave element. Such a relationship is also established in the surface acoustic wave devices described hereinafter.

Further, the structure of the IDT electrode 59 formed on the quartz substrate 58 is the same as the structure of the IDT electrode 2 formed on the quartz substrate 1 of FIG. 1. Therefore, detailed description thereof is omitted. In the surface acoustic wave device d having the above structure, the surface 58b that faces the surface of the quartz substrate 58 where the electrodes are formed is etched, thereby controlling the thickness t of the quartz substrate 58 so that the desired center frequency is obtained as described hereinafter. Further, the ceramic package 53 is sealed after controlling the frequency.

According to the above structure, it is possible to stabilize the inside of the package because the miniaturization of the package is easily performed and the adhesives are not necessary. As a result, it is possible to etch the surface 58b that faces the surface of the quartz substrate 58 where the IDT electrode 59 is formed by performing plasma etching using the fluorine gas, thereby controlling the thickness t of the quartz substrate 58 so that the desired center frequency is obtained.

Figure 5:
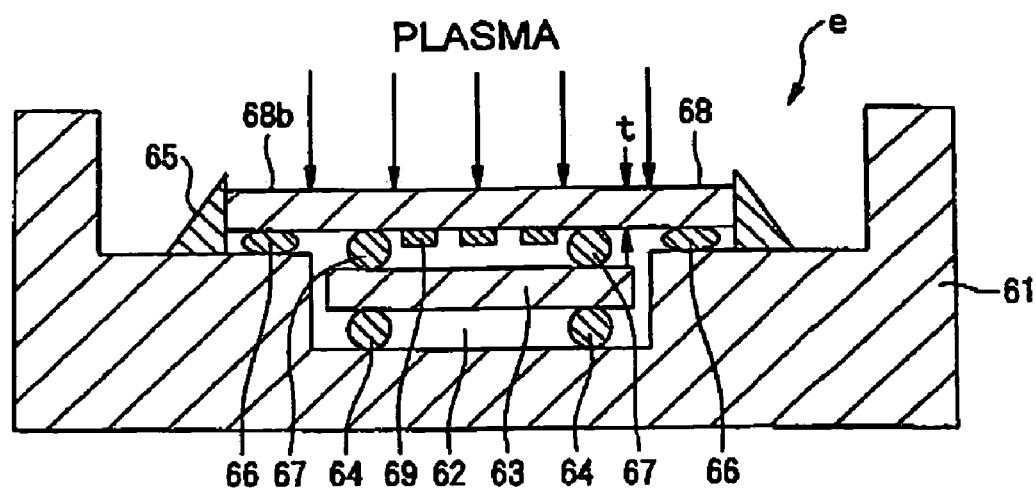
FIG. 5 is a cross-sectional view of a main portion of another surface acoustic wave device, to which the frequency controlling method according to the present invention is applied.

In the surface acoustic wave device, d, since the IC chip 51 is coated with the quartz substrate 58, it is possible to protect the IC chip 51 by the quartz substrate 58 and to prevent the IC chip 51 from being deteriorated by plasma when the plasma etching is performed. FIG. 5 is a cross-sectional view of the main portion of a surface acoustic wave device e, to which the frequency controlling method according to the present invention is applied.

In the surface acoustic wave device, e, a concave portion 62 is formed on the bottom portion of a ceramic package 61. An IC chip 63 is held in the concave portion 62. In addition, the IC chip 63 is electrically and mechanically connected to the bottom portion of the concave portion 62 by gold bumps 64. Mounting portions 65 are formed around the aperture of the concave portion 62. A quartz substrate 68 is inserted into the portion surrounded by the mounting portions 65 so that an IDT electrode 69 faces downward. In this state, the quartz substrate 68 is connected to the peripheral edges of the aperture of the concave portion 62 by a sealant 66 and is connected to the IC chip 63 by gold bumps 67. Therefore, the IC chip 63 is held in the concave portion 62 and also the concave portion 62 is vacuously sealed.

In addition, the structure of the IDT electrode 69 formed on the quartz substrate 68 is the same as the structure of the IDT electrode 2 formed on the quartz substrate 1 of FIG. 1. Therefore, detailed description thereof is omitted. In the surface acoustic wave device, e, having the above structure, the surface 68b that faces the electrode formed surface of the quartz substrate 68 is etched, thereby controlling the thickness t of the quartz substrate 68 so that the desired center frequency is obtained as described hereinafter. In addition, the ceramic package 61 is sealed after controlling the frequency.

According to the above structure, it is possible to easily miniaturize the package and to etch the surface 68b that faces the surface of the quartz substrate 68 where the IDT electrode 69 is formed by performing the plasma etching using the fluorine gas, thereby controlling the thickness t of the quartz substrate 68 so that the desired center frequency is obtained. In the surface acoustic wave device, e, it is possible to prevent the IC chip 63 from being deteriorated by plasma when the plasma etching is performed because the IC chip 63 is vacuously sealed in the concave portion 62.

Figure 6:
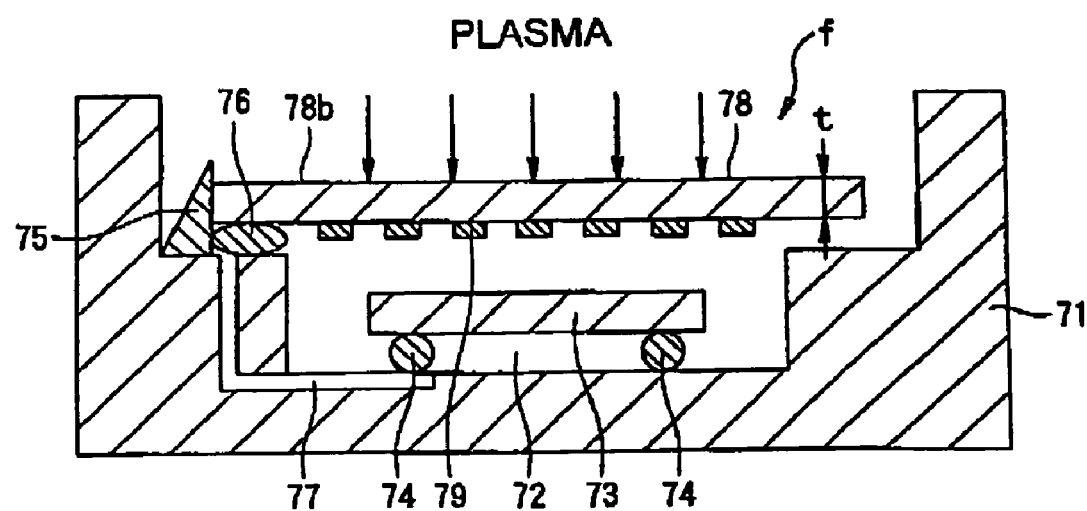
FIG. 6 is a cross-sectional view of a main portion of another surface acoustic wave device, to which the frequency controlling method according to the present invention is applied.

FIG. 6 is a cross-sectional view of the main portion of a surface acoustic wave device f, to which the frequency controlling method according to the present invention is applied. In the surface acoustic wave device f, a concave portion 72 is formed on the bottom portion of a ceramic package 71. An IC chip 73 is held in the concave portion 72. The IC chip 73 is electrically and mechanically connected to the bottom portion of the concave portion 72 by gold bumps 74.

A mounting portion 75 is formed on one side (one end side in the present embodiment) around the aperture of the concave portion 72. A quartz substrate 78 is disposed so that an IDT electrode 79 faces downward and that at least one side is supported by the mounting portion 75. In this state, at least one side of the quartz substrate 78 is attached to the peripheral edge of the aperture of the concave portion 72 by a conductive adhesive 76. Further, the quartz substrate 78 is electrically connected to the IC chip 73 through a through hole 77 disposed in the ceramic package 71.

As illustrated in FIG. 6, the quartz substrate 78 seals the concave portion 72. Therefore, the IC chip 73 in the concave portion 72 is coated with the quartz substrate 78. Further, the structure of the IDT electrode 79 formed on the quartz substrate 78 is the same as the structure of the IDT electrode 2 formed on the quartz substrate 1 of FIG. 1. Therefore, detailed description thereof is omitted. In the surface acoustic wave device, f, having the above structure, the surface 78b that faces the electrode formed surface of the quartz substrate 78 is etched, thereby controlling the thickness t of the quartz substrate 78 so that the desired center frequency is obtained as described hereinafter. Further, the ceramic package 71 is sealed after controlling the frequency.

According to the above structure, it is possible to miniaturize the package and to etch the surface 78b that faces the surface of the quartz substrate 78 where the IDT electrode 79 is formed by performing the plasma etching using the fluorine gas, thereby controlling the thickness t of the quartz substrate 78 so that the desired center frequency is obtained. In the surface acoustic wave device, f, the IC chip 73 is coated with the quartz substrate 78. Therefore, it is possible to protect the IC chip 73 by the quartz substrate 78 and to prevent the IC chip 73 from being deteriorated by the plasma when the plasma etching is performed.

In the surface acoustic wave device, f, illustrated in FIG. 6, the IC chip 73 is connected to the bottom portion of the concave portion 72 by the gold bumps 74. Instead of this, the IC chip 73 may be fixed to the bottom portion of the concave portion 72 by the adhesives. The IC chip 73 is electrically connected to the outside by performing wiring bonding. Embodiments of the frequency controlling method according to the present invention will now be described.

Figure 7:
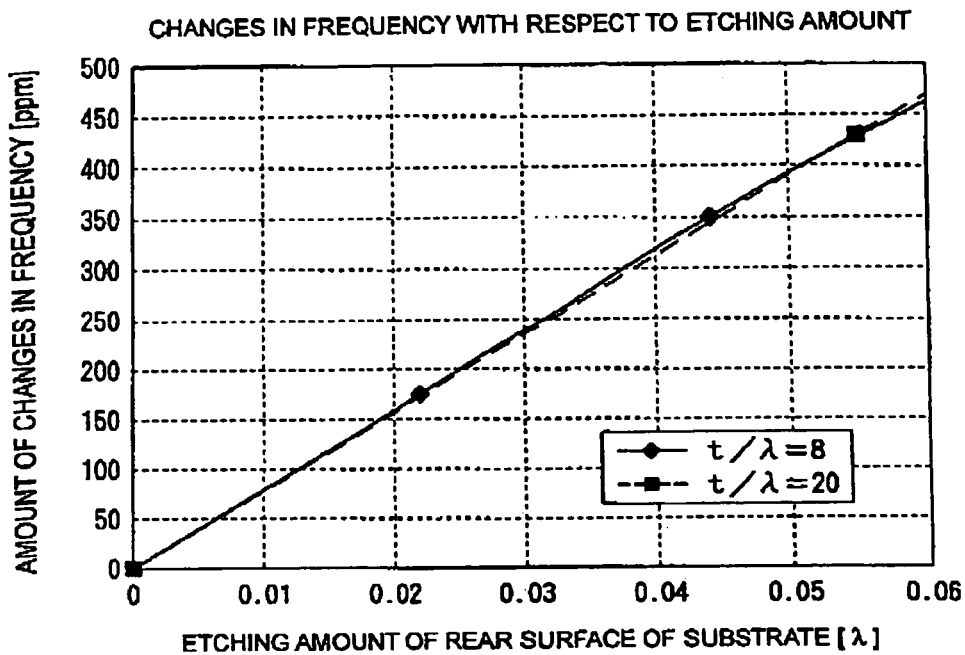
FIG. 7 illustrates an example of results of measuring the amount of changes in a frequency with respect to the etching amount of the rear surface of a quartz substrate.

A principle of the frequency controlling method according to the present invention will now be described with reference to FIGS. 7 and 8 before describing the embodiments of the frequency controlling method. FIG. 7 illustrates an example of results of measuring the amount of changes in the frequency with respect to the etching amount of the surface (the rear surface) that faces the electrode formed surface (the surface) of the quartz substrate. The results are obtained when the thickness $t/\lambda$ of the substrate obtained by standardizing the thickness t of the quartz substrate by an IDT wavelength $\lambda$ is '8' and '20'. Further, the Euler angle is (0°, 143.5°, 0°), and the standardized electrode thickness $h/\lambda$ is 0.03. Herein, the thickness $h/\lambda$ of the standardized electrode is obtained by standardizing the thickness h of the IDT electrode 2 by the IDT wavelength $\lambda$.

Figure 8:
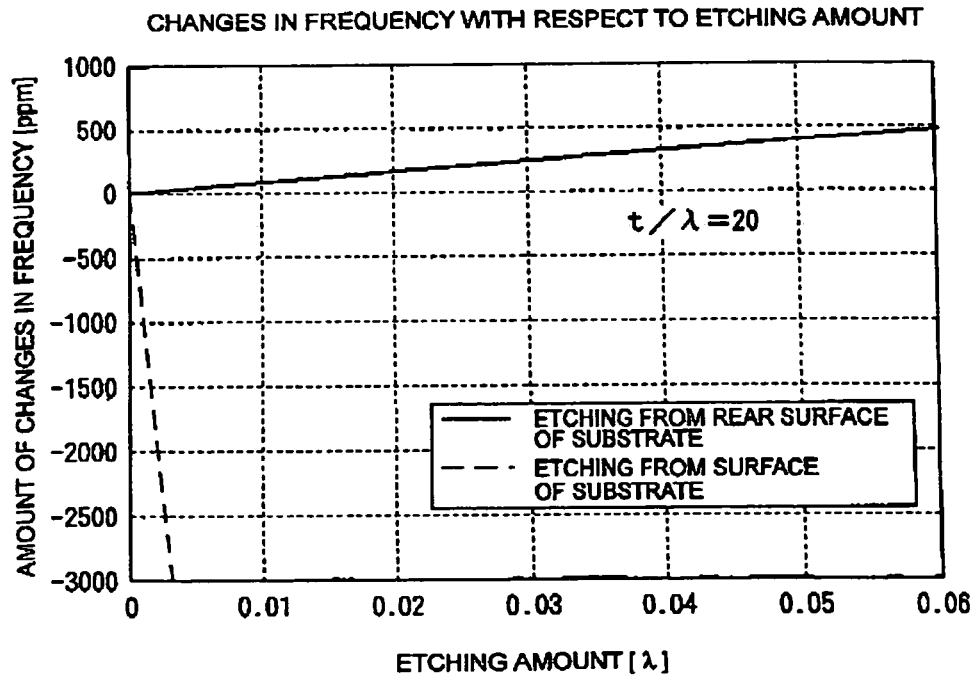
FIG. 8 illustrates an example of results of measuring the amount of changes in the frequency with respect to the etching amounts of the surface and the rear surface of the quartz substrate.

FIG. 8 illustrates an example of results of measuring the amount of changes in the frequency with respect to the etching amounts of the surface and the rear surface of the quartz substrate. The results are obtained when the standardized substrate thickness $t/\lambda$ is '20', the Euler angle is (0°, 143.5°, 0°), and the standardized electrode thickness $h/\lambda$ is 0.03. It is noted from FIG. 7 that it is possible to increase the center frequency (a resonant frequency) by etching the surface (the rear surface) that faces the electrode formed surface of the quartz substrate to reduce the thickness of the quartz substrate, thereby controlling the frequency of the surface acoustic wave device.

It is noted from FIG. 8, compared with the case where the surface of the quartz substrate is etched, when the rear surface thereof is etched, that the amount of changes of the frequency with respect to the amount of etching is small, that it is suitable for precisely controlling the frequency, and that, in particular, it is suitable for controlling the frequency of a surface acoustic wave device with a high frequency and a short IDT wavelength. According to the frequency controlling method of the present invention, it is possible to precisely control the frequency by etching the surface that faces the electrode formed surface of the quartz substrate in consideration of the above points.

Figure 9:
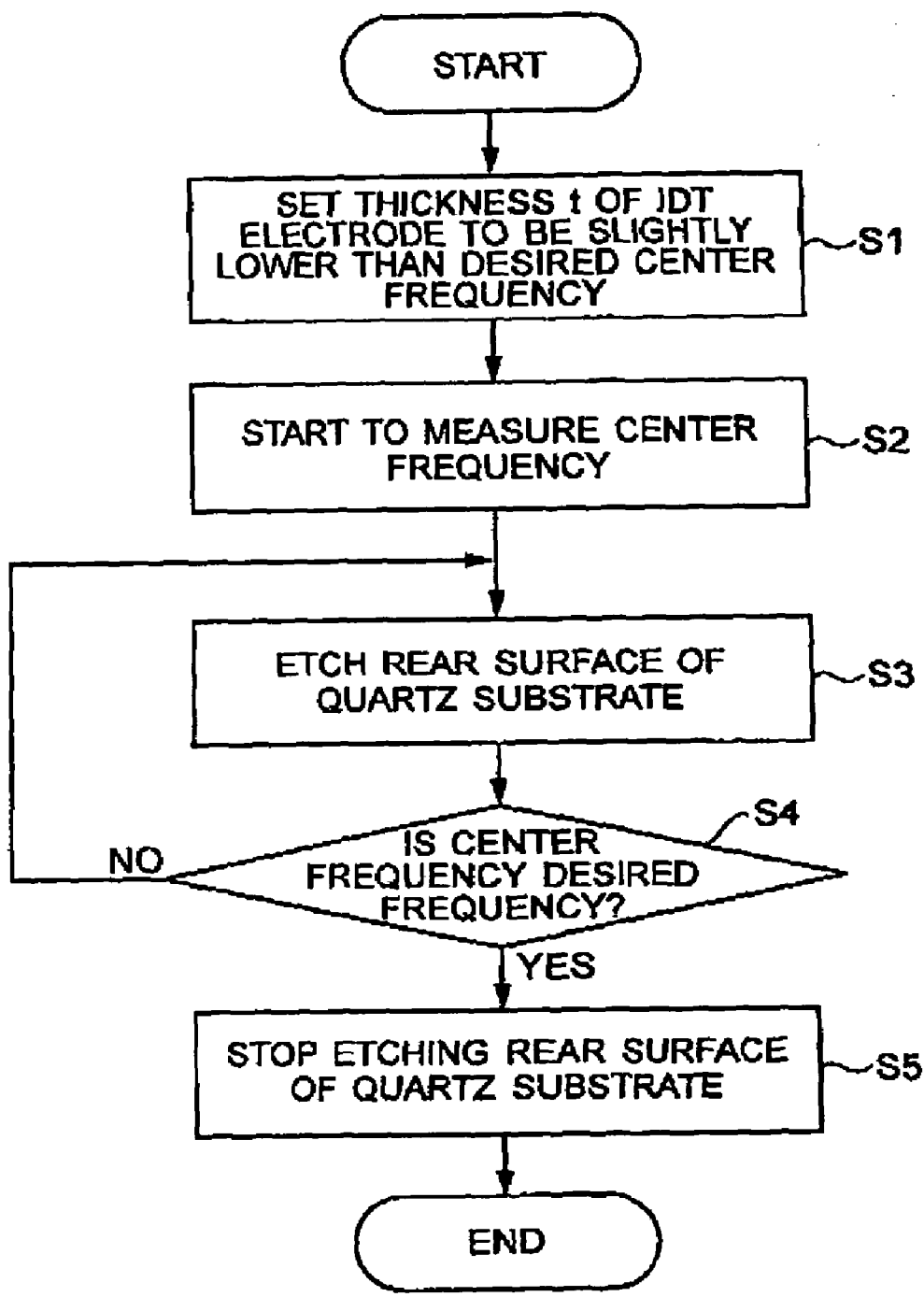
FIG. 9 is a flowchart describing the order of the frequency controlling method according to a first embodiment of the present invention.

A case where a first embodiment of the method of controlling the frequency of the surface acoustic wave device according to the present invention is applied to the surface acoustic wave device a illustrated in FIG. 1 is described with reference to FIG. 9. In this case, for example, the thickness h of the IDT electrode 2 formed on the quartz substrate 1 is set to be slightly larger than the desired thickness so that the center frequency is slightly lower than the desired frequency (step S1).

Next, a voltage is applied to the IDT electrode 2 and the center frequency is measured (the input and output are measured) (step S2). At this time, the measured center frequency is slightly lower than the desired frequency. The rear surface 1b of the quartz substrate 1 is etched while checking the measured center frequency (step S3). Herein, the rear surface 1b of the quartz substrate 1 is preferably etched by dry etching. As a result, the measured center frequency gradually increases and approaches the desired frequency by etching the rear surface 1b of the quartz substrate 1. Further, the rear surface 1b of the quartz substrate 1 is continuously etched until the center frequency is the desired frequency (steps S3 and S4). The etching is stopped at the point of time where the center frequency is the desired frequency (step S5).

According to the above-mentioned frequency controlling method, it is possible to precisely control the center frequency to be the desired frequency. Further, it is possible to control the frequency without eroding the electrode patterns formed on the electrode formed surface of the quartz substrate. Therefore, it is possible to realize a surface acoustic wave device capable of reducing changes in the center frequency with the lapse of time after controlling the frequency and of performing a stable operation for a long time.

Figure 10:
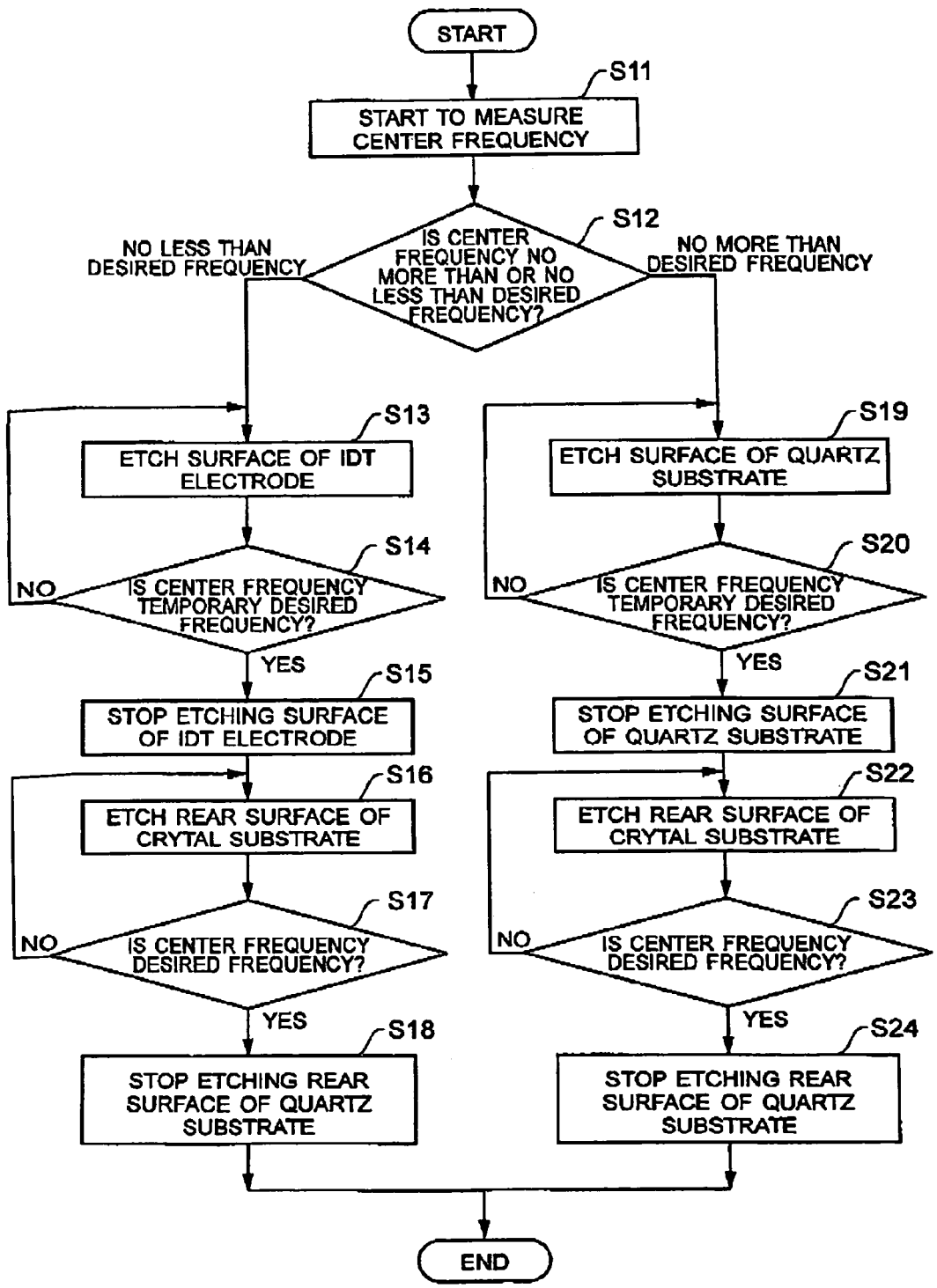
FIG. 10 is a flowchart describing the order of the frequency controlling method according to a second embodiment of the present invention.

A case where a second embodiment of the method of controlling the frequency of the surface acoustic wave device according to the present invention is applied to the surface acoustic wave device a illustrated in FIG. 1 will be described with reference to FIG. 10. The above is useful when the thickness h of the IDT electrodes 2 formed on the quartz substrates 1 of the surface acoustic wave devices a is not uniform in manufactured products and it is necessary to control the frequency. First, a voltage is applied to the IDT electrode 2 and the center frequency is measured (step S11). Next, it is determined whether the measured center frequency is no more than or no less than the desired frequency (step S12).

As a result, when it is determined that the measured center frequency is no more than the desired frequency, the process proceeds to the step S13. When the measured center frequency is no less than the desired frequency, the process proceeds to the step S19. When the measured center frequency is the desired frequency, because it is not necessary to control the frequency, the controlling is terminated. In the step S13, the surface of the IDT electrode 2 is etched, for example, wet-etched while checking the measured frequency. As a result, the measured center frequency increases in a short time by etching the surface of the IDT electrode 2. The surface of the IDT electrode 2 is continuously etched until the measured center frequency is a temporary desired frequency set to be slightly lower than the desired frequency of the center frequency (steps S13 and S14). The etching is stopped at the point of time where the measured center frequency is the temporary desired frequency (step S15). In the steps S13 and S14, the frequency is roughly (preliminarily) controlled.

Next, the rear surface 1b of the quartz substrate 1 is etched while checking the measured frequency (step S16). As a result, the measured center frequency gradually increases and approaches the desired frequency by etching the rear surface 1b of the quartz substrate 1. The rear surface 1b of the quartz substrate 1 is continuously etched until the center frequency is the desired frequency (steps S16 and S17). The etching is stopped at the point of time where the center frequency is the desired frequency (step S18). In the steps S16 and S17, the frequency is finely controlled.

On the other hand, in the step S19, the surface of the quartz substrate 1 can be etched (for example, wet etched) while checking the measured frequency. As a result, the measured center frequency decreases in a short time by etching the surface of the quartz substrate 1. The surface of the quartz substrate 1 is continuously etched until the measured center frequency is the temporary desired frequency set to be slightly lower than the desired frequency of the center frequency (steps S19 and S20). The etching is stopped at the point of time where the measured center frequency is the temporary desired frequency (step S21). In the steps S19 and S20, the frequency is roughly (preliminarily) controlled.

Next, the rear surface 1b of the quartz substrate 1 is etched while checking the measured frequency (step S22). As a result, the measured center frequency gradually rises and approaches the desired frequency by etching the rear surface 1b of the quartz substrate 1. The rear surface 1b of the quartz substrate 1 is continuously etched until the center frequency is the desired frequency (steps S22 and S23). The etching is stopped at the point of time where the measured center frequency is the desired frequency (step S24). In the steps S22 and S23, the frequency is finely controlled.

According to the second embodiment of the frequency controlling method, even when the desired center frequencies are not uniform, it is possible to precisely control the frequency in a short time as a whole by roughly controlling the frequency in a short time by etching the surface of the quartz substrate or the surface of the IDT electrode and finely controlling the frequency by etching the rear surface of the quartz substrate. It is possible to roughly control the frequency by wet etching the surface of the IDT electrode or the surface of the quartz substrate and to finely control the frequency by plasma-etching the rear surface of the quartz substrate. Therefore, it is possible to prevent the frequency from changing after controlling the frequency due to the residing aluminum generated by etching the surface of the quartz substrate by plasma.

According to the above embodiment, the frequency is roughly controlled by etching the surface of the quartz substrate (steps S19 and S20) or by etching the surface of the IDT electrode (steps S13 and S14) and then, is finely controlled by etching the rear surface of the quartz substrate. However, the following controlling method can be used. That is, when it is determined that after measuring the frequency in step S11, the center frequency is no more than a first desired frequency, the process proceeds (to the step S16 or S22) where the rear surface of the quartz substrate is etched.

If necessary, it is possible to control the center frequency to be the desired frequency by sequentially etching the surface of the IDT electrode, the surface of the quartz substrate, and the rear surface of the quartz substrate. A case where a third embodiment of the method of controlling the frequency of the surface acoustic wave device according to the present invention is applied to the surface acoustic wave devices b to f illustrated in FIGS. 2 to 6 will now be described.

Figure 11:
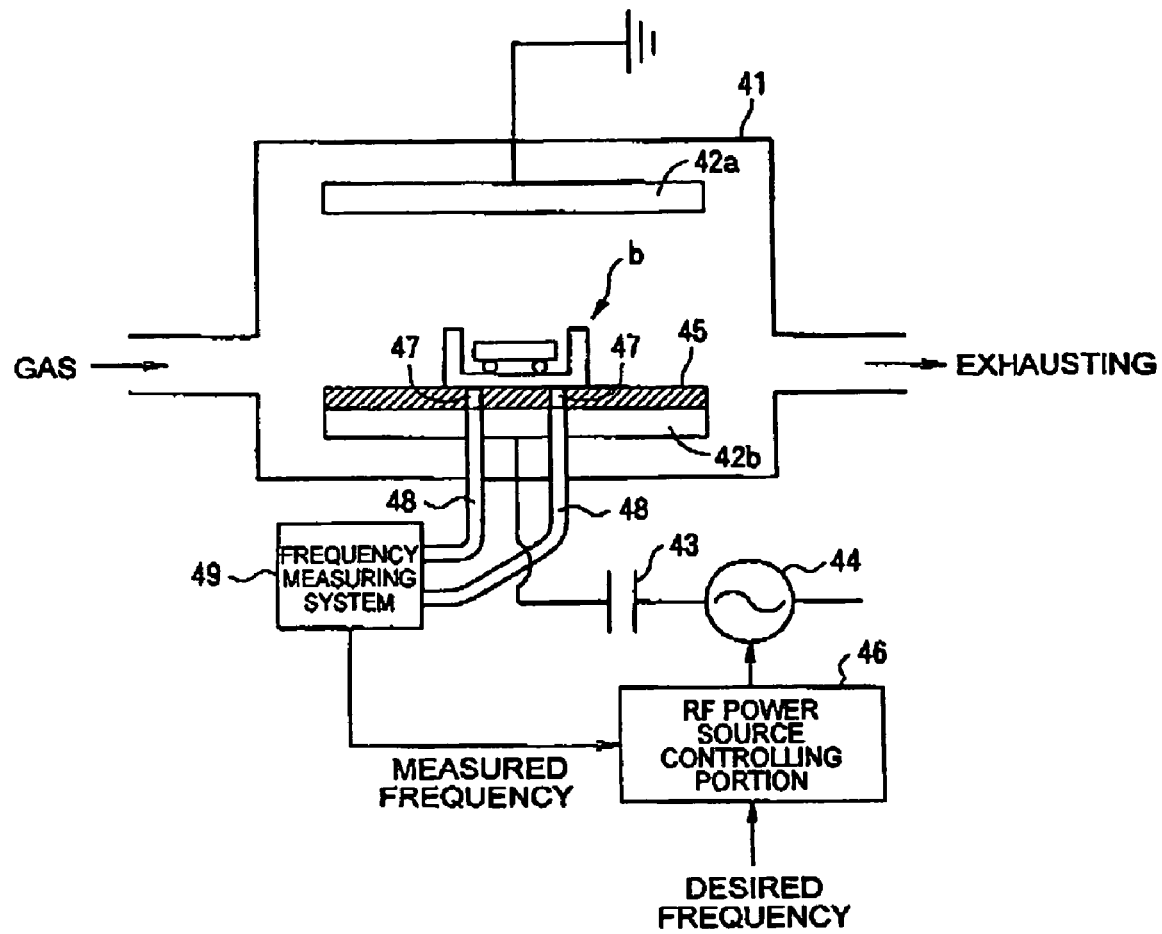
FIG. 11 illustrates a schematic structure of an etching device according to a third embodiment of the frequency controlling method of the present invention.

According to the third embodiment of the frequency controlling method, the etching device (the controlling device) illustrated in FIG. 11 is used. Therefore, a schematic structure of the etching device will be described. As illustrated in FIG. 11, the etching device includes a chamber 41. An upper electrode 42a and a lower electrode 42b are arranged in the chamber 41. The upper electrode 42a is grounded, and also the lower electrode 42b is connected to a radio frequency (RF) power source (a high frequency power source) 44 through a capacitor 43. A supporting stand 45 is disposed on the lower electrode 42b. The surface acoustic wave device b is mounted on the supporting stand 45.

In addition, measuring terminals 47, 47 for measuring the frequency of the pseudo-longitudinal leaky surface acoustic wave generated by the IDT electrode 12 of the surface acoustic wave device, b, are provided in the supporting stand 45. The measuring terminals 47, 47 are connected to a frequency measuring system 49 through electric cables 48,

48. The frequency measuring system 49 supplies the measured center frequency to an RF power source controlling portion 46. The RF power source controlling portion 46 controls the operation of the RF power source 44 in accordance with the supplied measured center frequency.

A case where the frequency of the surface acoustic wave device, b, is controlled using the etching device illustrated in FIG. 11 will now be described. In this case, for example, the thickness h of the IDT electrode 12 formed on the quartz substrate 11 is set to be slightly larger than the desired thickness so that the center frequency is slightly lower than the desired frequency.

Next, the surface acoustic wave device, b, is mounted on the supporting stand 45 so that the surface (the rear surface 11*b*) that faces the electrode formed surface of the quartz substrate 11 faces upward. Therefore, the surface acoustic wave device b is disposed as illustrated in FIG. 11. Next, the center frequency of the surface acoustic wave device b is measured by the frequency measuring system 49. At this time, the measured center frequency is slightly lower than the desired frequency. While exhausting the chamber 41, an etching gas is introduced to the chamber 41 and plasma is generated.

At this time, a high frequency voltage is applied to between the upper electrode 42*a* and the lower electrode 42*b* by the RF power source 44. Therefore, ions generated by the plasma are accelerated in an electric field, thereby etching the rear surface 11*b* of the quartz substrate 11. Therefore, the measured center frequency gradually increases and approaches the desired frequency by etching the rear surface 11*b* of the quartz substrate 11. During the etching, the frequency measuring system 49 measures the center frequency of the surface acoustic wave device, b, and supplies the measured center frequency to the RF power source controlling portion 46. The RF power source controlling portion 46 compares the measured center frequency with the predetermined desired frequency and stops the operation of the RF power source 44 when the measured center frequency is the desired frequency. As a result, the etching is terminated.

According to the frequency controlling method, even by the surface acoustic wave device, in which the quartz substrate where the IDT electrode is formed is mounted in the package, it is possible to easily and precisely control the frequency by etching the surface that faces the electrode formed surface of the quartz substrate. A case where the frequency of the surface acoustic wave device, c, illustrated in FIG. 3 is controlled using the etching device illustrated in FIG. 11 will now be described.

In this case, for example, the thickness h of the IDT electrode 22 formed on the quartz substrate 21 is set to be slightly larger than the desired thickness so that the center frequency is slightly lower than the desired frequency. The surface acoustic wave device c is mounted on the supporting stand 45 so that the surface that faces the electrode formed surface of the quartz substrate 21 faces upward. In this case, the thickness t of the quartz substrate 21 is controlled by etching the concave portion 23 of the quartz substrate 21 (refer to FIG. 3). The frequency controlling method is the same as that in the case of the above-mentioned surface acoustic wave device b. Therefore, description thereof is omitted.

According to the above-mentioned frequency controlling method, even by the surface acoustic wave device such that the surface acoustic wave element is mounted in the package so that the IDT electrode faces upward and wire bonding is performed, it is possible to easily and precisely control the frequency by etching the surface that faces the electrode formed surface of the quartz substrate. A case where the frequency of the surface acoustic wave device d illustrated in FIG. 4 is controlled using the etching device illustrated in FIG. 11 will now be described.

In this case, for example, the thickness h of the IDT electrode 59 formed on the quartz substrate 58 is set to be slightly larger than the desired thickness so that the center frequency is slightly lower than the desired frequency. The surface acoustic wave device d is mounted on the supporting stand 45 so that the surface (the rear surface 58*b*) that faces the electrode formed surface of the quartz substrate 58 faces upward. Further, the thickness t of the quartz substrate 58 is controlled by etching the rear surface 58*b* of the quartz substrate 58 (refer to FIG. 4). The frequency controlling method is essentially the same as that in the case of the above-mentioned surface acoustic wave device b. Therefore, description thereof is omitted.

According to the frequency controlling method, even when the surface acoustic wave element and the IC chip are held in one package, it is possible to etch the surface that faces the electrode formed surface of the quartz substrate without deteriorating the IC chip and to easily control the frequency of the surface acoustic wave element. A case where the frequency of the surface acoustic wave device e illustrated in FIG. 5 is controlled using the etching device illustrated in FIG. 11 will now be described.

In this case, for example, the thickness h of the IDT electrode 69 formed on the quartz substrate 68 is set to be slightly larger than the desired thickness so that the center frequency is slightly lower than the desired frequency. The surface acoustic wave device e is mounted on the supporting stand 45 so that the surface (the rear surface 68*b*) that faces the electrode formed surface of the quartz substrate 68 faces upward. The thickness t of the quartz substrate 68 is controlled by etching the rear surface 68*b* of the quartz substrate 68 (refer to FIG. 5). The frequency controlling method is essentially the same as that in the case of the above-mentioned surface acoustic wave device b. Therefore, description thereof is omitted.

According to the frequency controlling method, even when the surface acoustic wave element and the IC chip are held in one package, it is possible to etch the surface that faces the electrode formed surface of the quartz substrate without deteriorating the IC chip and to easily control the frequency of the surface acoustic wave element. A case where the frequency of the surface acoustic wave device f illustrated in FIG. 6 is controlled using the etching device illustrated in FIG. 11 will now be described.

In this case, for example, the thickness h of the IDT electrode 79 formed on the quartz substrate 78 is set to be slightly larger than the desired thickness so that the center frequency is slightly lower than the desired frequency. The surface acoustic wave device f is mounted on the supporting stand 45 so that the surface (the rear surface 78*b*) that faces the electrode formed surface of the quartz substrate 78 faces upward. The thickness t of the quartz substrate 78 is controlled by etching the rear surface 78*b* of the quartz substrate 78 (refer to FIG. 6). The frequency controlling method is essentially the same as that in the case of the above-mentioned surface acoustic wave device b. Therefore, description thereof is omitted.

According to the frequency controlling method, even when the surface acoustic wave element and the IC chip are held in one package, it is possible to etch the surface that faces the electrode formed surface of the quartz substrate without deteriorating the IC chip and to easily control the frequency of the surface acoustic wave element. The frequencies of the above-mentioned surface acoustic wave devices b to f are controlled in the order illustrated in FIG. 9. However, the frequencies can be controlled in the order illustrated in FIG. 10. In this case, the frequency is roughly controlled by preliminarily controlling the frequency and then, is finely controlled.

An embodiment of the electronic apparatus according to the present invention will now be described. Mobile telephones and keyless entry systems may be used as the electronic apparatus according to the present embodiment. In the case of the mobile telephone, the surface acoustic wave device illustrated in FIGS. 1 to 3, which is controlled by the above-mentioned frequency controlling method, is used as the frequency-selecting filter of the mobile telephone. In the case of the keyless entry system, the surface acoustic wave device is used as the resonator of the oscillator of the keyless entry system. The surface acoustic wave devices illustrated in FIGS. 4 to 6 may be used as the oscillators of various electronic apparatuses.

That is, the electronic apparatus according to the present embodiment includes the surface acoustic wave device as the filter, the resonator, or the oscillator. According to the electronic apparatus having the above structure, it is possible to provide various electronic apparatuses using the filters, the resonators, or the oscillators, capable of reducing changes in the center frequencies with the lapse of time and of performing stable operations for a long time.

While this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. A method of controlling frequency of a surface acoustic wave device, comprising:
   a quartz substrate; and
   IDT electrodes formed on the quartz substrate, the IDT electrode exciting quasi-longitudinal leaky surface acoustic waves,
   the frequency being controlled by controlling a thickness of the quartz substrate using a rear surface of the quartz substrate that faces a surface where the IDT electrodes are formed.

2. The method of controlling the frequency of the surface acoustic wave device according to claim 1, the frequency being controlled by dry etching the rear surface that faces a surface of the quartz substrate where the IDT electrodes are formed.

3. The method of controlling the frequency of the surface acoustic wave device according to claim 1, at least one of the surface of the quartz substrate where the IDT electrodes are formed and the surface of the IDT electrodes being etched, to preliminarily control the frequency before controlling the frequency.

4. An electronic apparatus comprising a surface acoustic wave device as a filter or a resonator,
   the surface acoustic wave device being a surface acoustic wave device whose frequency is controlled by the frequency controlling method according to claim 1.

5. A method of controlling the frequency of a surface acoustic wave device, comprising:
   a quartz substrate; and
   IDT electrodes formed on the quartz substrate, the IDT electrode exciting quasi-longitudinal leaky surface acoustic waves,
   the frequency being controlled by arranging the surface acoustic wave device such that the quartz substrate is held in a package with an aperture so that the IDT electrodes face upward in a chamber, to which an etching gas is introduced, and etching rear surface that faces a surface of the quartz substrate where the IDT electrodes are formed until a desired frequency is obtained while measuring an input-output characteristic of the surface acoustic wave device.

6. The method of controlling the frequency of the surface acoustic wave device according to claim 5, at least one of the surface of the quartz substrate where the IDT electrodes are formed and the surface of the IDT electrodes being etched, to preliminarily control the frequency before controlling the frequency.

7. A method of controlling frequency of a surface acoustic wave device, comprising:
   a quartz substrate; and
   IDT electrodes formed on the quartz substrate, the IDT electrode exciting quasi-longitudinal leaky surface acoustic waves,
   the frequency being controlled by arranging the surface acoustic wave device such that the quartz substrate is held in a package so that the IDT electrodes face downward in a chamber, to which an etching gas is introduced, and etching rear surface that faces a surface of the quartz substrate where the IDT electrodes are formed until a desired frequency is obtained while measuring an input-output characteristic of the surface acoustic wave device.

8. The method of controlling the frequency of the surface acoustic wave device according to claim 7, at least one of the surface of the quartz substrate where the IDT electrodes are formed and the surface of the IDT electrodes being etched, to preliminarily control the frequency before controlling the frequency.

9. A method of controlling frequency of a surface acoustic wave device, comprising:
   a quartz substrate;
   a surface acoustic wave element having IDT electrodes formed on the quartz substrate, the IDT electrode exciting quasi-longitudinal leaky surface acoustic waves;
   an IC chip operating together with the surface acoustic wave element; and
   a package,
   the frequency being controlled by holding the IC chip on the bottom portion side of the package, arranging the surface acoustic wave device such that the surface acoustic wave element is held in the package so that the IDT electrodes face downward and cover the IC chip in a chamber, to which an etching gas is introduced, and etching a rear surface that faces the surface of the quartz substrate where the IDT electrodes are formed until a desired frequency is obtained while measuring an input-output characteristic of the surface acoustic wave element.

10. The method of controlling the frequency of the surface acoustic wave device according to claim 9, at least one of the surface of the quartz substrate where the IDT electrodes are formed and the surface of the IDT electrodes being etched, to preliminarily control the frequency before controlling the frequency.

* * * * *